(12) United States Patent
Wasson et al.

(10) Patent No.: US 8,543,190 B2
(45) Date of Patent: Sep. 24, 2013

(54) INDUCTIVE COIL DEVICE ON FLEXIBLE SUBSTRATE

(75) Inventors: James R. Wasson, Tempe, AZ (US); Clark B. Norgaard, Phoenix, AZ (US); Bruce C. Fleischhauer, Chandler, AZ (US); Michael F. Mattes, Chandler, AZ (US); Randal C. Schulhauser, Phoenix, AZ (US)

(73) Assignee: Medtronic, Inc., Minneapolis, MN (US)

( * ) Notice: Subject to any disclaimer, the term of this patent is extended or adjusted under 35 U.S.C. 154(b) by 348 days.

(21) Appl. No.: 12/847,307

(22) Filed: Jul. 30, 2010

(65) Prior Publication Data

US 2012/0029343 A1 Feb. 2, 2012

(51) Int. Cl.
*A61B 5/05* (2006.01)
*H01F 27/28* (2006.01)

(52) U.S. Cl.
USPC .......................... 600/424; 336/180

(58) Field of Classification Search
USPC ................... 600/424; 336/180; 29/846, 606; 343/895, 702
See application file for complete search history.

(56) References Cited

U.S. PATENT DOCUMENTS

| | | | |
|---|---|---|---|
| 2,911,605 A * | 11/1959 | Wales, Jr. | ...................... 336/200 |
| 4,441,498 A | 4/1984 | Nordling | |
| 7,498,802 B2 | 3/2009 | Takahata | |
| 2002/0047812 A1 | 4/2002 | Otomo et al. | |
| 2004/0017329 A1 | 1/2004 | Fang et al. | |
| 2006/0139214 A1 | 6/2006 | Deng et al. | |
| 2007/0046475 A1 | 3/2007 | Carrender | |
| 2007/0135803 A1* | 6/2007 | Belson | .............................. 606/1 |
| 2008/0198075 A1 | 8/2008 | Yoshioka | |
| 2008/0238600 A1 | 10/2008 | Olson | |
| 2009/0174557 A1 | 7/2009 | Nikitin et al. | |

FOREIGN PATENT DOCUMENTS

| | | |
|---|---|---|
| JP | 59105304 A | 6/1984 |
| JP | 63020805 A | 1/1988 |
| JP | 2009246141 A | 10/2009 |

OTHER PUBLICATIONS

International Search Report and Written Opinion of PCT/US2011/033937, dated Feb. 22, 2012, 16 pages.
Invitation to Pay Additional Fees for international application No. PCT/US2011/033937, dated Nov. 17, 2011, 5 pages.
International Preliminary Report on Patentability from corresponding PCT Application No. PCT/US2011/033937 dated Feb. 14, 2013 (11 pages).

* cited by examiner

*Primary Examiner* — Michael Rozanski
(74) *Attorney, Agent, or Firm* — Evans M. Mburu

(57) ABSTRACT

A device includes a flexible substrate, N coiled conductors, and a plurality of folding regions. The N coiled conductors are deposited on the flexible substrate and connected in series by conductive interconnects. N is greater than 1. Each of the folding regions is defined by a separation distance between adjacent ones of the N coiled conductors. The conductive interconnects traverse the folding regions between the N coiled conductors to connect the N coiled conductors in series. The flexible substrate is folded such that the N coiled conductors form a stack of N coiled conductors.

29 Claims, 16 Drawing Sheets

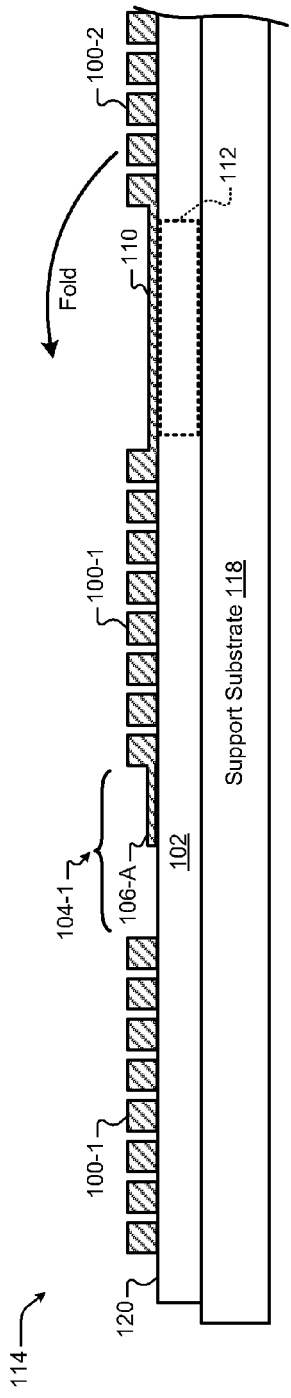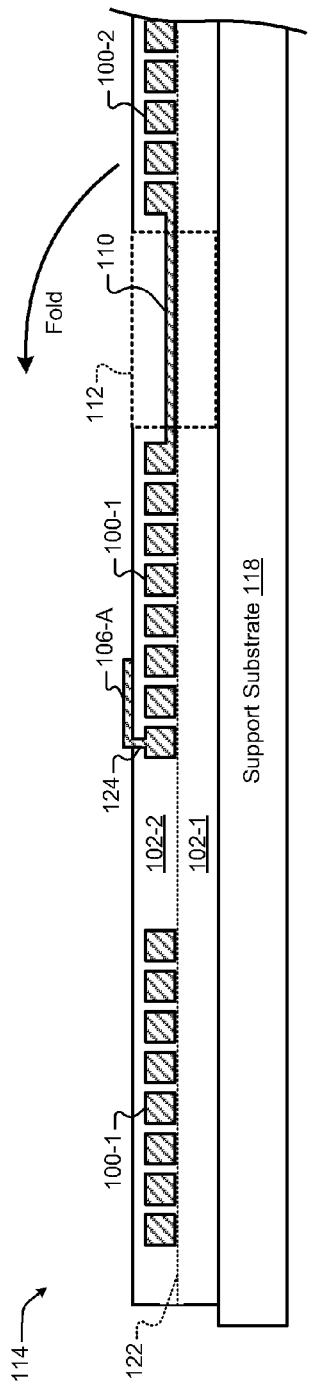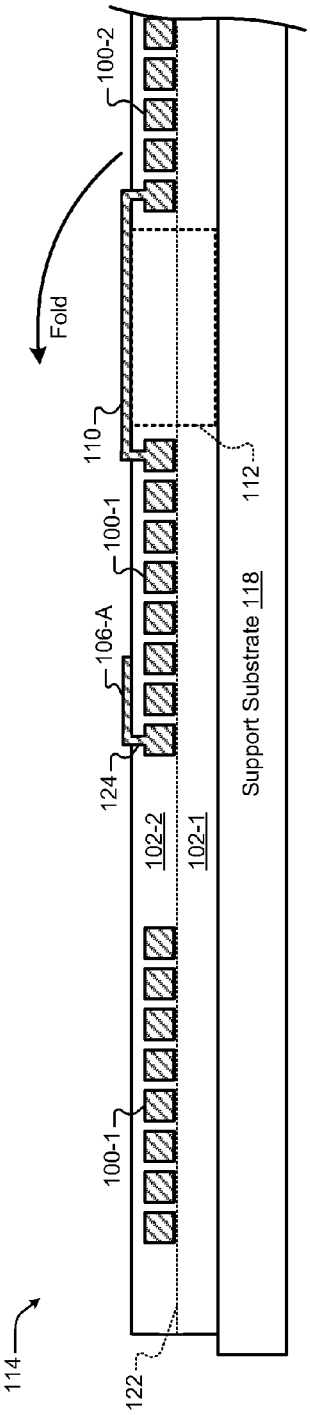

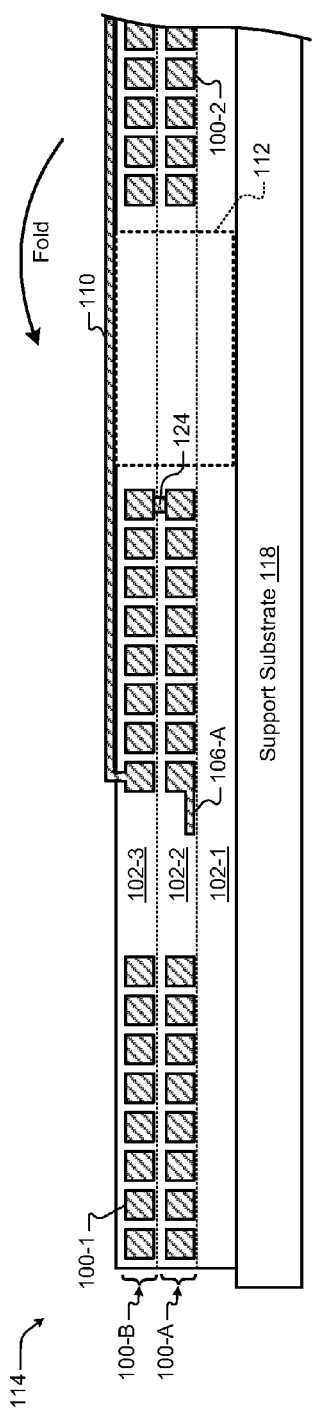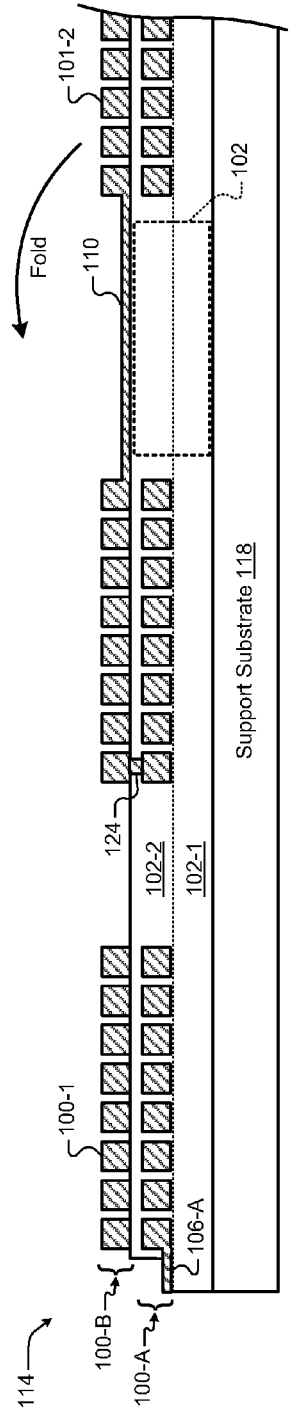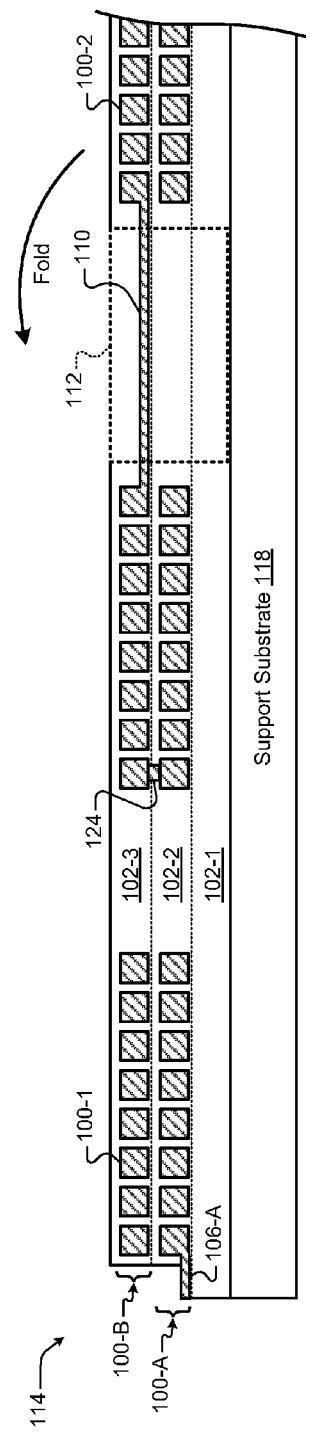

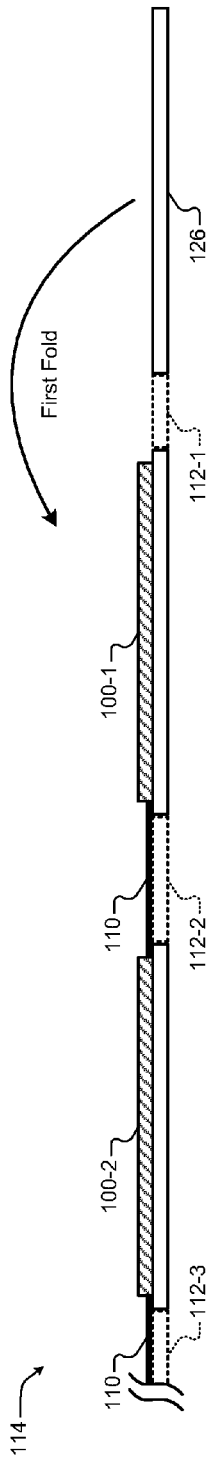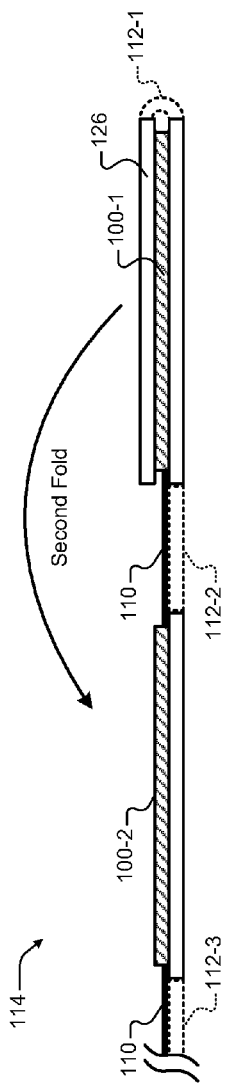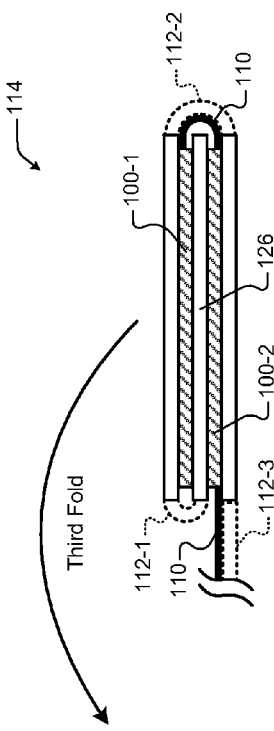

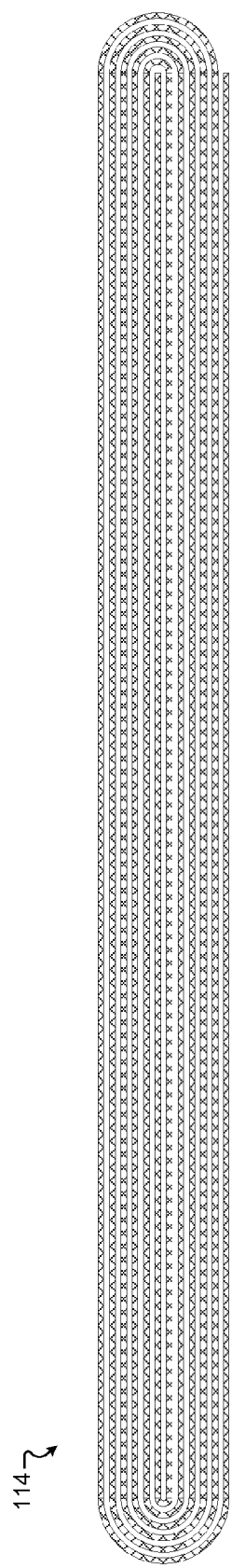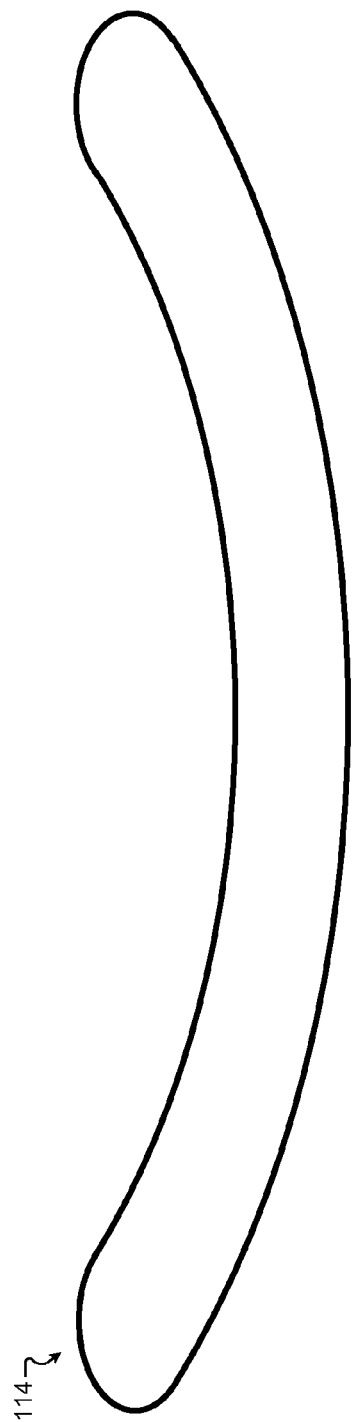
FIG. 7A
FIG. 7B

INDUCTIVE COIL DEVICE ON FLEXIBLE SUBSTRATE

TECHNICAL FIELD

The disclosure relates to inductive coil devices, and, more particularly, to inductive coil devices fabricated on a flexible substrate.

BACKGROUND

Small inductive coils may be used as antennas in electronic devices to transmit and receive data. For example, small inductive coils may be fabricated as wire-wound inductors or integrated circuit (IC) inductors. Wire-wound inductors may include a wire (e.g., a copper wire) wrapped around a supporting core material. The supporting core material may be a plastic or ceramic material, for example, that may approximate an air core. Alternatively, the supporting core material may include a magnetic core. An IC inductor may be fabricated from multiple separate coil layers deposited on a semiconductor substrate (e.g., silicon). The multiple coil layers may be connected through vias in order to form a single inductive coil.

SUMMARY

Both wire-wound inductors and IC inductors are rigid devices and therefore may not be deformed. This lack of flexibility/deformability may inhibit placement of both the wire-wound and IC inductive devices in space constrained applications. Additionally, regarding wire-wound inductors, since a size of the wire used is generally large as compared to an IC wire, wire-wound inductors may occupy more space in an electronic device than an IC inductor. IC inductors, although providing precise wire pitch and compact form factor relative to wire-wound inductors, may only achieve a limited number of turns relative to wire-wound inductors since planarity issues may arise during fabrication of multi-layer integrated devices.

The present disclosure is directed to a flexible inductive device that includes a substantial number of precisely fabricated turns in a small form factor. Accordingly, the flexible inductive device of the present disclosure may be more suitable than wire-wound and IC inductors for certain space constrained applications. In addition to the small form factor of the inductive device, the flexibility of the inductive may allow the inductive device to flex and form in a space constrained application, allowing for increased placement options relative to wire-wound and IC inductors.

The flexible inductive device according to the present disclosure includes a plurality of conductive coils connected in series on a flexible substrate. The plurality of conductive coils may be precisely fabricated using various semiconductor fabrication techniques, for example. The flexible substrate, including the conductive coils, may be folded such that the conductive coils overlap with one another and share a common axis. The overlapping of conductive coils effectively increases a total number of turns of the inductive device. For example, a total number of turns of the folded inductive device may be equal to the sum of the number of turns of each of the conductive coils of the folded device. Additionally, each of the conductive coils may include multiple layers of coils that further add to the number of turns of the folded inductive device.

In one example, the present disclosure is directed to a device comprising a flexible substrate, N coiled conductors, and a plurality of folding regions. The N coiled conductors are deposited on the flexible substrate and connected in series by conductive interconnects. N is greater than 1. Each of the folding regions is defined by a separation distance between adjacent ones of the N coiled conductors. The conductive interconnects traverse the folding regions between the N coiled conductors to connect the N coiled conductors in series. The flexible substrate is folded such that the N coiled conductors form a stack of N coiled conductors.

In other examples, the present disclosure is directed to a device comprising a flexible substrate and N coiled conductors. The N coiled conductors are deposited on the flexible substrate and connected in series. N is greater than 1. At least one of the N coiled conductors circumscribes a center region a plurality of times. The flexible substrate is folded such that the N coiled conductors form a stack of N coiled conductors.

In other examples, the present disclosure is directed to method comprising depositing a flexible material on a support substrate and depositing N coiled conductors on a portion of the flexible material. N is greater than 1. The method further comprises separating the flexible material from the support substrate and folding the flexible material such that the N coiled conductors form a stack of N coiled conductors.

In other examples, the present disclosure is directed to an image guided therapy (IGT) system comprising an inductive device and a tracking system. The inductive device comprises a flexible substrate and N coiled conductors deposited on the flexible substrate and connected in series. At least one of the N coiled conductors circumscribes a center region a plurality of times and the flexible substrate is folded such that the N coiled conductors form a stack of N coiled conductors. N is greater than 1. The tracking system receives signals from the inductive device and determines a position of the inductive device in the IGT system based on the received signals.

The details of one or more examples are set forth in the accompanying drawings and the description below. Other features, objects, and advantages will be apparent from the description and drawings, and from the claims.

BRIEF DESCRIPTION OF THE DRAWINGS

FIGS. 2A-2C show example cross-sectional views of coiled conductors as single layers deposited on a flexible substrate.

FIGS. 3A-3C show example cross-sectional views of coiled conductors that include multiple layers on a flexible substrate.

FIGS. 5A-5D illustrate an example folding operation used to fold an inductive device.

FIG. 7A shows a side view of an inductive device after folding of coiled conductors over one another.

FIG. 7B shows an outline of the inductive device of FIG. 7A that has been flexed from its original form.

DETAILED DESCRIPTION

Figure 1A:
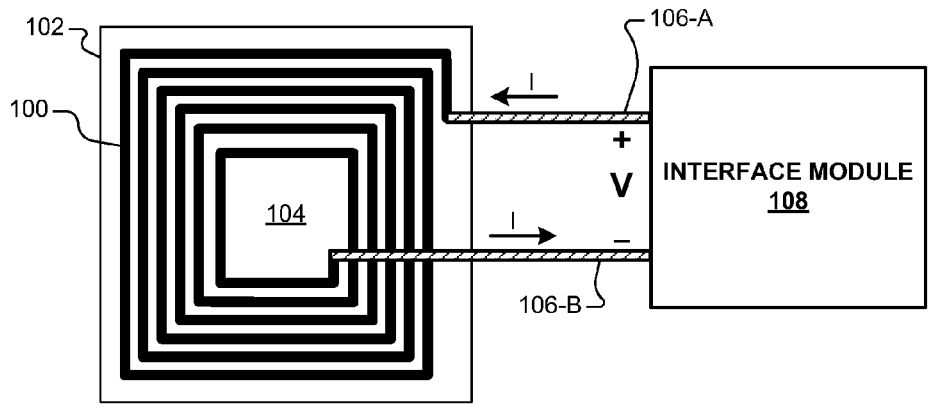
FIG. 1A illustrates an example coiled conductor deposited on a flexible substrate.

FIG. 1A illustrates a coiled conductor 100 (hereinafter "coil 100") deposited on a flexible substrate 102. Coil 100 and flexible substrate 102 may comprise a thin film electrical device that may be used, for example, as an antenna, an inductor, or a transformer as explained hereinafter. Coil 100 defines a central core region 104, around which coil 100 is deposited. Coil 100 may circumscribe central core region 104 one or more times (e.g., 100 or more turns may be achieved). In other words, coil 100 forms a spiral around central core region 104. Coil 100 includes leads 106-A, 106-B which are connected to ends of coil 100. Leads 106-A, 106-B provide for electrical connection of coil 100 to an electronic device (e.g., interface module 108). Although coil 100 is shown as having two leads 106-A, 106-B connected to the ends of coil 100, more leads may be attached at any point along coil 100.

Interface module 108 represents an electronic device that may be connected to coil 100. Interface module 108 may comprise, for example, an application specific integrated circuit (ASIC), a microprocessor, a microcontroller, a digital signal processor (DSP), a field-programmable gate array (FPGA), or equivalent discrete or integrated logic circuitry. The functions attributed to interface module 108 herein may be embodied as hardware, firmware, software, or any combination thereof.

In some examples, interface module 108 may represent a receiving device that wirelessly receives signals (e.g., via electromagnetic waves) when coil 100 is used as an antenna. In other words, interface module 108 may monitor a voltage/current induced in coil 100 when coil 100 is used as an antenna. In other examples, interface module 108 may apply a voltage across coil 100 to induce a current through coil 100, e.g., in order to generate an electromagnetic field. In other words, interface module 108 may represent a transmitter that applies a voltage/current to coil 100 in order to transmit electromagnetic waves. Current direction and voltage polarity are illustrated in FIG. 1A as "I" and "V," respectively.

Figure 1B:
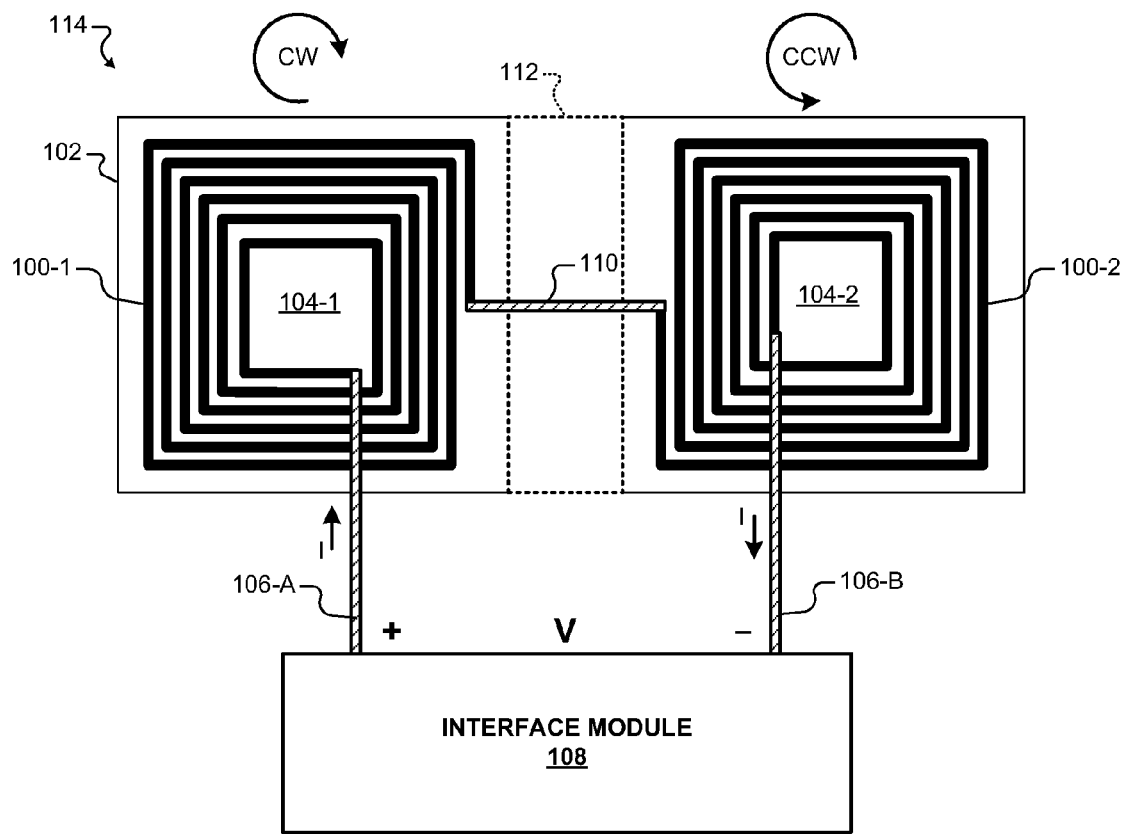
FIG. 1B illustrates two coiled conductors connected in series on a flexible substrate.

FIG. 1B illustrates two coils 100-1, 100-2 connected in series. Coil 100-1 is electrically connected to coil 100-2 through a conductive interconnect 110. Interconnect 110 may be fabricated from the same material as coils 100-1, 100-2, and in some examples, may be formed during the same process steps as coils 100-1, 100-2.

The clockwise arrow (CW) and counterclockwise arrow (CCW) above coils 100-1 and 100-2, respectively, illustrate relative orientations of coils 100-1 and 100-2. Relative orientations of coils describe, for example, a direction of current through coils 100-1, 100-102. For example, as illustrated in FIG. 1B, current "I" through coil 100-1 is in a clockwise direction, while current "I" through coil 100-2 is in the counterclockwise direction. Relative orientations of coils, for example, may also describe a voltage/current induced in coils 100-1, 100-2 due to an electromagnetic field. An electromagnetic field having the same direction through coils 100-1, 100-2 (e.g., into the paper) may induce a current having an opposite direction. When coils 100-1, 100-2 are folded over one another as described herein with respect to FIGS. 4 and 5A-5D, coils 100-1, 100-2 may have the same orientation.

Coils 100-1, 100-2 are both deposited on flexible substrate 102 or embedded in flexible substrate 102. Coils 100-1, 100-2 define a folding region 112 of flexible substrate 102 between coils 100-1, 100-2. Folding region 112 is illustrated using dotted lines. Folding region 112 may be a portion of flexible substrate 102 which may be bent so that coils 100-1, 100-2 may be folded over one another as described, for example, in FIGS. 4 and 5A-5D. Coils 100-1, 100-2 may have the same orientation when folded over each other and may share a common axis. For example, coils 100-1, 100-2, and core regions 104-1, 104-2 of respective coils 100-1, 100-2 may overlap when folded over. A combination of multiple coils (e.g., coils 100-1, 100-2) on flexible substrate 102 that may be folded at one or more folding regions (e.g., folding region 112) may be referred to as "a foldable inductive device 114."

Folding region 112 may be a region of flexible substrate 102 between coils 100-1, 100-2 that does not include a coiled conductor, but instead includes interconnect 110 that extends across folding region 112 to provide electrical connection between adjacent coils 100-1, 100-2. As described herein, interconnect 110 may be deposited on the top surface of flexible material 102 such that interconnect 110 is exposed above flexible material 102. In some examples, interconnect 110 may be fabricated on the surface of flexible substrate 102 that is located on the inside radius of a bend when coil 100-1 is folded over coil 100-2. In other examples, interconnect 110 may be embedded in flexible substrate 102 so that it is not exposed on any surface of flexible substrate 102. In still other examples, interconnect 110 may be fabricated on a surface of flexible substrate 102 which is located on the outside radius of a bend.

Each coil 100-1, 100-2 may include a plurality of turns. A number of turns corresponding to a coil may be the number of times a coil circumscribes a corresponding core region. Coils 100-1, 100-2 may include the same number of turns or a different number of turns. Folding of coils 100-1, 100-2 over each other may form an inductive device 114 having a number of turns equal to the sum of the turns of the separate coils 100-1, 100-2. Similarly, an inductive device 114 including a series of coils may be folded such that an inductive device having a greater number of turns may be produced, e.g., a number of turns equal to the sum of all of the turns of the series of coils. Additionally, a number of turns may depend on the structure of each coil 100 of inductive device 114. For example, as explained hereinafter with reference to FIGS. 2A-2C and FIGS. 3A-3C, the number of turns of each coil 100 in inductive device 114 may be dependent on a number of layers used to fabricate each coil 100. Coils including more than one layer may include a greater number of turns than a single layer coil.

FIGS. 2A-2C and 3A-3C illustrate different example structural combinations of coils 100-1, 100-2 and flexible substrate 102. In FIGS. 2A-2C, flexible substrate 102 may include one or more layers of flexible material, e.g., flexible substrate layers 102-1, 102-2, 102-3 (collectively referred to as "flexible substrate 102"). Similarly, in FIGS. 2A-2C and 3A-3C, coils 100-1, 100-2 may include one or more coil layers 100-A, 100-B, collectively forming either coil 100-1 or coil 100-2.

Flexible substrate 102 may be formed from any suitable flexible material, e.g., polyimide. Flexible substrate 102 may be deposited on support substrate 118 (e.g., a silicon wafer), for example, using a spin coating process. For example, flexible substrate 102 may be a polyimide layer that is spun onto support substrate 118 at a thickness of approximately 0.25 mil (i.e., approximately 5 μm). Although flexible substrate 102 is described as a polyimide layer, other materials may be used. In general, any material may provide a suitable flexible substrate 102 as long as the material used is flexible and has mechanical strength as a thin film (e.g., having thickness in the range of 5-10 μm).

Coils 100-1, 100-2 and interconnect 110 may be a conductive material deposited on flexible substrate 102. The conductive material may include metals, such as, copper, a copper alloy, a silver alloy, gold, platinum, palladium, etc. In some examples, coil 100 may be deposited on flexible substrate 102, e.g., using electroplating or electroless plating techniques. Coil 100 may have a thickness in the range of approximately 15-20 μm, and a trace width of approximately 20 μm. In general, coil 100 may be formed from any material having an appropriate bulk resistance and malleability. In some examples, coil 100 may be formed from a conductive material that provides both a low bulk resistance and a malleability that allows for bending at folding region 112. Photolithographic techniques along with etching techniques may be used to pattern the coils 100-1, 100-2, and interconnects 110 on the flexible substrate 102.

Although core region 104 is illustrated as being void of material other than the flexible material, core region 104 may include a core material in addition to the flexible material. For example, core region 104 may include a magnetic material deposited in core region 104 that concentrates flux generated by the coils 100-1, 100-2.

FIG. 2A illustrate support substrate 118 upon which flexible substrate 102 (e.g., one or more flexible substrate layers 102-1, 102-2, 103-3) and the coil 100 (e.g., one or more coil layers 100-A, 100-B) may be deposited. Additionally, multiple interconnected coils 100 may be fabricated on support substrate 118 as described hereinafter with reference to FIGS. 4 and 6, for example. Support substrate 118 may include any material on which the flexible substrate 102 and coils 100-1, 100-2 may be deposited. In some examples, support substrate 118 may include rigid materials, e.g., rigid as compared to flexible substrate 102, so as to provide structural support for fabrication of the inductive device 114. Support substrate 118 may be a silicon or glass wafer, for example.

FIGS. 2A-2C shows a cross-sectional view of coils 100-1, 100-2 as a single layer deposited on flexible substrate 102. The hashed boxes on flexible substrate 102 illustrate an example cross-sectional slice of coils 100-1, 100-2. Coil 100-1 and a portion of coil 100-2, as shown in FIGS. 2A-2C, may be fabricated according to the following procedure. First, a flexible material (e.g., polyimide or an epoxy based photoresist such as SU-8) may be deposited on support substrate 118 according to the processing steps described above. Accordingly, flexible substrate 102 may be deposited on support substrate 118, for example, using a spin coating process. In some examples, the flexible material may include Durimide® (e.g., Durimide® series 116), which is commercially available from FUJIFILM Electronic Materials U.S.A., Inc., of East Providence, R.I. Subsequent to deposition of the flexible material, coils 100-1, 100-2 and interconnect 110 may be deposited, for example, using electroplating. Coils 100-1, 100-2 and interconnect 110 may then be patterned using photolithographic and etching operations.

Coils 100-1, 100-2, and interconnect 110, as illustrated in FIG. 2A, may be deposited on top surface 120 of flexible substrate 102. In other words, at least a portion of coils 100-1, 100-2 and interconnect 110 may extend above flexible substrate 102 so that conductive material that comprises coils 100-1, 100-2, and interconnect 110 extends from the top surface 120 of flexible substrate 102. Leads 106-A, 106-B may be traces of metal deposited on flexible substrate 102 along with coils 100-1, 100-2. Leads 106-A, 106-B may also include a contact area on flexible substrate 102 that may receive bonding wires that provide connection of coils 100-1, 100-2 to interface module 108.

FIG. 2B shows a cross-sectional view of coils 100-1, 100-2 deposited on flexible substrate layer 102-1. A flexible substrate layer 102-2 is deposited over the top of coils 100-1, 100-2. Flexible substrate layer 102-2 may be deposited over coils 100-1, 100-2 using a spin coating process, for example, in which polyimide is spun over top of coils 100-1, 100-2, as described above. The dotted line 122 in FIGS. 2B and 2C between flexible substrate layers 102-1 and 102-2 illustrates, conceptually, a demarcation between flexible substrate layers 102-1, 102-2.

Coils 100-1, 100-2, and interconnect 110, as illustrated in FIG. 2B, do not extend above flexible substrate layer 102-2. In other words, coils 100-1, 100-2, and interconnect 110 are embedded within flexible substrate layer 102-2. Accordingly, inductive device 114 of FIG. 2B does not include exposed conductive material like foldable inductive device 114 of FIG. 2A. FIG. 2C, however, shows a different configuration for interconnect 110. Interconnect 110 of FIG. 2C is deposited on top of flexible substrate layer 102-2, while coils 100-1, 100-2 are embedded in flexible substrate layer 102-2. Accordingly, in FIG. 2C, interconnect 110 may be exposed conductive material on a top surface of inductive device 114.

In FIGS. 2B-2C and FIGS. 3A-3C, vias 124 may provide a conductive connection through flexible substrate layers (e.g., 102-2, 102-3). Vias 124 may be patterned and etched in flexible material, for example, using a photolithographic process followed by an etching process and subsequent deposition of conductive material. As illustrated in FIGS. 2B-2C and FIGS. 3A-3C, vias 124 may provide for coil connection between coil layers 100-A, 100-B and/or provide for connection of leads to coils 100-1, 100-2.

FIGS. 3A-3C show cross-sectional views of coils 100-1, 100-2 that each include multiple coil layers 100-A, 100-B. Although both coils 100-1, 100-2 in FIGS. 3A-3C include the same number of coil layers (i.e., 2), in other examples, coils 100-1, 100-2 of foldable inductive device 114 may include coils having different numbers of coil layers. For example, coil 100-1 may have a single coil layer while coil 100-2 may have multiple coil layers, or vice versa. Although foldable inductive devices 114 having one or two coil layers are illustrated in FIGS. 2A-2C and FIGS. 3A-3C, foldable inductive devices 114 may include more than two coil layers.

FIG. 3A shows a cross-sectional view of coils 100-1, 100-2 that include multiple coil layers 100-A, 100-B, but not interconnect 110, embedded in multiple flexible substrate layers 102-1, 102-2, 102-3. Coil layers 100-A, 100-B and flexible substrate layers 102-1, 102-2, and 102-3 may be deposited as described above, e.g., using spin coating and electroplating processes. Coil layers 100-A, 100-B may be electrically connected using vias 124. FIG. 3B shows a cross-sectional view of coils 100-1, 100-2 in which only one coil layer (e.g., coil layer 100-A) is embedded in flexible substrate 102. FIG. 3C shows a cross-sectional view of coils 100-1, 100-2, and interconnect 110 which are each embedded in flexible substrate 102.

Coil layers 100-A, 100-B may have the same orientation. Therefore, coil layers 100-A, 100-B connected through via 124 may be collectively referred to as a coil (e.g., 100-1 or 100-2). When coil layers 100-A, 100-B have the same orientation, a total number of turns of a coil may be equal to the sum of the number of turns of each layer. For example, a total number of turns of coil 100-1 may be the sum of the number of turns in coil layer 100-A and coil layer 100-B of coil 100-1. According to the example of FIG. 1B, coil layers 100-A, 100-B of coil 100-1 may be oriented in a clockwise direction, while coil layers 100-A, 100-B of coil 100-2 may be oriented in a counterclockwise direction.

Figure 4:
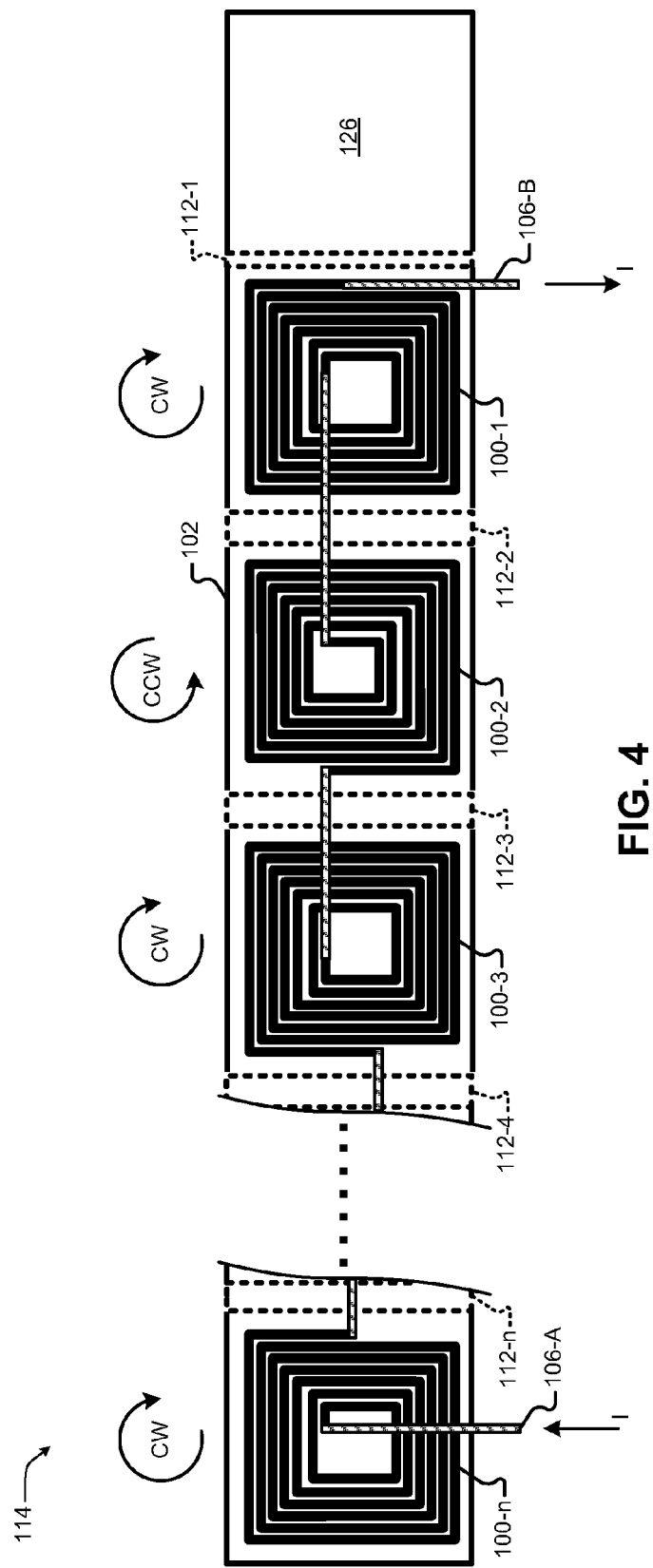
FIG. 4 shows a plurality of coiled conductors connected in series on a flexible substrate.

Referring now to FIG. 4, a plurality of coils 100-1, 100-2, . . . , 100-n (collectively "N coils 100") are deposited on flexible substrate 102. The N coils 100 are connected in series by interconnects. Orientations of the N coils 100 alternate from coil to coil. In other words, each coil of the N coils is adjacent to coils having opposite orientations. For example, coil 100-1 has a clockwise orientation and coil 100-2 (i.e., the adjacent coil) has a counterclockwise orientation. As a further example, coil 100-2 has a counterclockwise orientation and adjacent coils 100-1, 100-3 have clockwise orientations.

Each of the N coils is separated from the other coils by foldable regions 112-1, 112-2, . . . , 112-n (collectively "foldable regions 112"). Each foldable region 112 is illustrated as a dotted box. For example coil 100-1 is separated from coil 100-2 by foldable region 112-2. As an additional example, coil 100-2 is separated from coil 100-3 by foldable region 112-3. An interconnect, illustrated as a hashed box, traverses each foldable region 112 to connect the N coils 100 in series.

As illustrated in FIG. 4, inductive device 114 may include an insulating flap 126 in some examples. Insulating flap 126 may be a piece (e.g., a flap) of flexible substrate 102 that does not include any conductive material. In other words, insulating flap 126 may be a portion of flexible substrate 102 which does not include any coils or interconnects. Insulating flap 126 may be folded over coil 100-1 in order to insulate coil 100-1 from coil 100-2 during a folding operation as described herein, for example, when coils 100-1, 100-2 are deposited above flexible substrate 102, i.e., when coils 100-1, 100-2 are exposed.

Although support substrate 118 is not shown in FIG. 4, inductive device 114 may be fabricated on support substrate 118. In some examples, multiple inductive devices 114 may be fabricated on the same support substrate. For example, multiple inductive devices 114 may be fabricated on a single silicon wafer, initially by spinning a single polyimide layer onto the silicon wafer, then using the single polyimide layer as flexible substrate 102 for a plurality of inductive devices 114.

Inductive device 114 may be folded, during a folding operation, such that adjacent coils overlap with each other. During the folding operation, flexible substrate 102 may be removed from support substrate 118. In examples where flexible substrate 102 is a polyimide layer deposited on a silicon wafer, flexible substrate 102 may be peeled from support substrate 118. During removal of inductive device 114, or after complete removal of inductive device 114, inductive device 114 may be folded (or rolled) as described herein.

The N coils 100 deposited on flexible substrate 102 form a strip of N coils 100 connected in series. The strip includes coils 100 at each end. For example, coil 100-1 is located at one end of the strip and coil 100-n is located at the other end of the strip. During the folding operation, described for example in FIGS. 5A-5D, the strip of N coils 100 is folded (i.e., rolled) such that coil 100-1 is located in a center of a stack of coils 100. In other words, coil 100-1 is enveloped by flexible substrate 102 and the other coils 100 of the strip. Coil 100-n is located on an outside of the stack of coils 100 after the folding operation.

Interconnects 110 as illustrated in FIG. 4 may be deposited on a layer of flexible material that is separate from coils 100 of inductive device 114 so that interconnects 110 do not short coils 100 as inductive device 114 is folded. For example, interconnect 110 between coil 100-1 and 100-2 may be deposited on a separate layer (i.e., insulated from) coil 100-1 and coil 100-2 such that interconnect 110 does not cause a short in coils 100-1, 100-2.

Folding of inductive device 114 is shown in FIGS. 5A-5D. Coils 100-1, 100-2, 100-3 are illustrated as hashed rectangles. Interconnects 110 between coils 100-1, 100-2, 100-3 are illustrated as bold lines. Folding regions 112 are illustrated as dotted lines.

In FIG. 5A, inductive device 114 is not folded, but instead laid flat, as would be the case after fabrication on support substrate 118. During a first fold, insulating flap 126 is folded over coil 100-1 at folding region 112-1, as illustrated by the arrow labeled "First Fold." In FIG. 5B, insulating flap 126 is illustrated as folded over coil 100-1. Folding region 112-1 is illustrated as forming a bending radius. As will be discussed hereinafter with reference to FIGS. 8A-8B, folding regions (e.g., 112-1, 112-2, . . . , 112-n) may include stress relief regions 128 that facilitate bending in the folding regions 112. In examples where coils 100 are exposed above the surface of flexible substrate 102, insulating flap 126 may insulate coil 100-1 from other coils on inductive device 114 during subsequent folding.

During a second fold, as illustrated by the arrow labeled "Second Fold" in FIG. 5B, insulating flap 126 and coil 100-1 are folded over coil 100-2. In FIG. 5C, insulating flap 126 and coil 100-1 are illustrated as folded on top of coil 100-2. Insulating flap 126 provides insulation between coil 100-1 and coil 100-2 when inductive device 114 is folded. For example, when coil 100-1 and coil 100-2 are not covered with flexible material, insulating flap 126 provides insulation between coils 100-1 and 100-2 to prevent shorting of the two coils 100-1, 100-2. In other examples, coil 100-1 may be covered with flexible material, and insulating flap 126 may not be included as part of inductive device 114.

When inductive device 114 is folded, folding region 112-2 may form a bending radius. Interconnect 110 is on an inside radius of folding region 112-2 when folding region 112-2 is bent. For example, interconnect 110 may be on the inside of the bending radius when interconnect 110 is deposited on a top surface of flexible substrate 102. Depositing interconnect 110 on the inside of a bending radius may prove beneficial for the durability of interconnect 110 and in turn the durability and reliability of inductive device 114. For example, when interconnect 110 is located on the inside of a bending radius, interconnect 110 may be in compression, and therefore may be more durable than if interconnect 110 was located on the outside of a bending radius where the interconnect would be in tension during a bend. Furthermore, when interconnect 110 is located on the inside of a bending radius, even if interconnect 110 fractures, interconnect 110 may still form a conductive path since a fractured interconnect may be compressed together on the inside of the bending radius. Although interconnects 110 are illustrated on the inside of bending radii in FIGS. 5A-5D, in other examples, interconnects 110 may be located on the outside of bending radii.

Figure 5D:
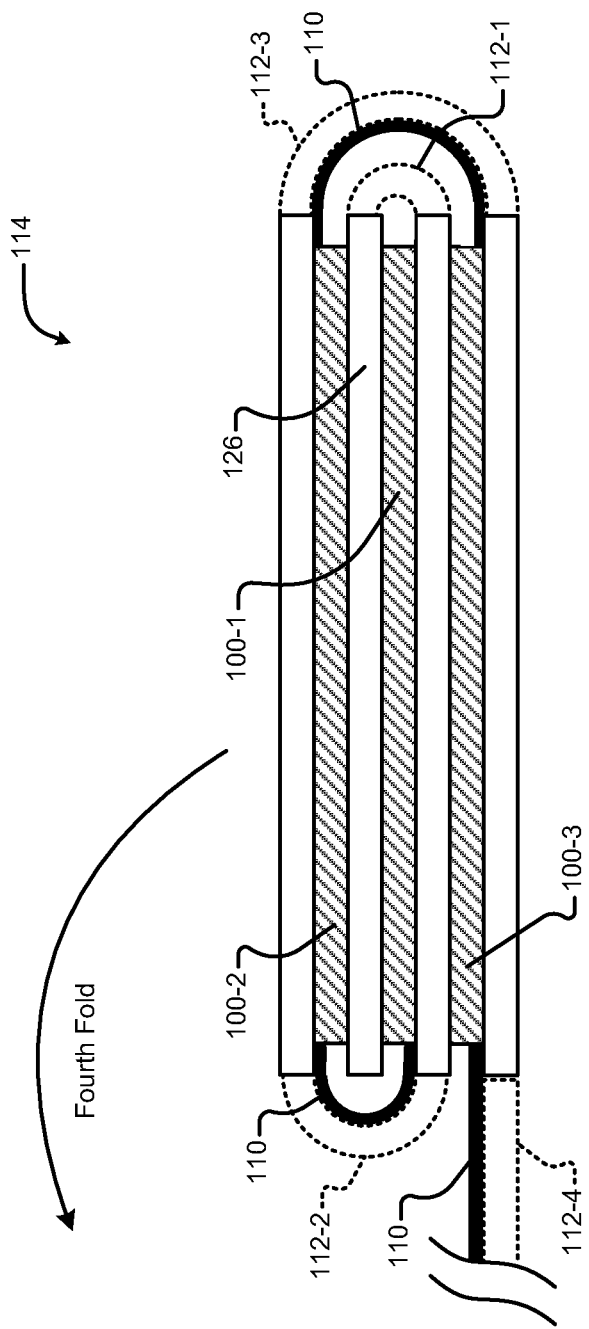

During a third fold, as illustrated by the arrow labeled "Third Fold" in FIG. 5C, insulating flap 126, coil 100-1, and coil 100-2 are folded over another coil 100-3 (illustrated in FIG. 5D). Referring now to FIG. 5D, inductive device 114 is illustrated after a third fold. Inductive device 114 includes three bent folding regions 112-1, 112-2, 112-3, two of which include an interconnect 110. Note that a bending radius of folding region 112-3 is greater than a bending radius of folding region 112-2, which in turn is greater than a bending radius of folding region 112-1. Since a bending radius of folding regions 112 increases to compensate for increased thickness of inductive device 114 as inductive device 114 is folded, folding regions 112 of increasing length may be fabricated as described with reference to FIG. 6.

As illustrated in FIG. 5D, coil 100-3 is insulated from coil 100-1 by the portion of flexible substrate 102 supporting coil 100-1. In this manner, portions of flexible substrate 102 may insulate the coils from one another as inductive device 114 is folded. For example, after a fourth fold of inductive device 114, the portion of flexible substrate 102 supporting coil 100-2 would insulate coil 100-2 from coil 100-4 (not shown). The structure of inductive device 114 may be referred to as a self insulating since the flexible substrate 102 on which the coils 100 are deposited provides insulation between the coils 100 themselves.

Coils 100 may be substantially concentric and parallel when inductive device 114 is folded. The orientation of coils 100 prior to folding may be arranged so that the folding of inductive device 114 causes the coils 100 to have the same orientation after inductive device 114 is folded. For example, in FIG. 4, coil 100-1 is in the clockwise direction. When coil 100-1 is folded over coil 100-2, which is in the counterclockwise direction, coil 100-1 may be in the counterclockwise direction. Accordingly, both coil 100-1 and coil 100-2 may be in the same direction after folding of coil 100-1 over coil 100-2. Folding of coil 100-1 over 100-2, then folding the combination of coils 100-1 and 100-2 over coil 100-3 may result in coils 100-1 and 100-2 having the same orientation as coil 100-3 (i.e., clockwise). In this manner, in some examples, if coils 100 are arranged on flexible substrate 100 so that orientations of the coils 100 are staggered (i.e., alternate counterclockwise and clockwise), then coils 100 may be folded, as described above, in order to increase a number of turns of inductive device 114 oriented in the same direction. The total number of turns of inductive device 114 may be equal to the sum of the number of turns of each of the coils 100 when folded.

The folding operation, as illustrated in FIGS. 5A-5D, may result in a stack of coils 100 that are substantially parallel and that share a common axis. The common axis may be described as a straight line that intersects core regions 104 of each of the coils 100 in the stack. Furthermore, in some examples, the common axis may be perpendicular to a plane corresponding to of each of the coils 100. After the folding operation, one of the coils 100 (e.g., coil 100-1 in FIG. 5D) is enveloped by flexible substrate 102 and the other coils 100. In other words, flexible substrate 102 and other coils 100 are wrapped around coil 100-1. In the example of FIG. 5D, coil 100-1, which was located on the edge of the strip of coils as illustrated in FIG. 4, is located in a center of the stack of coils comprising inductive device 114.

Figure 6:
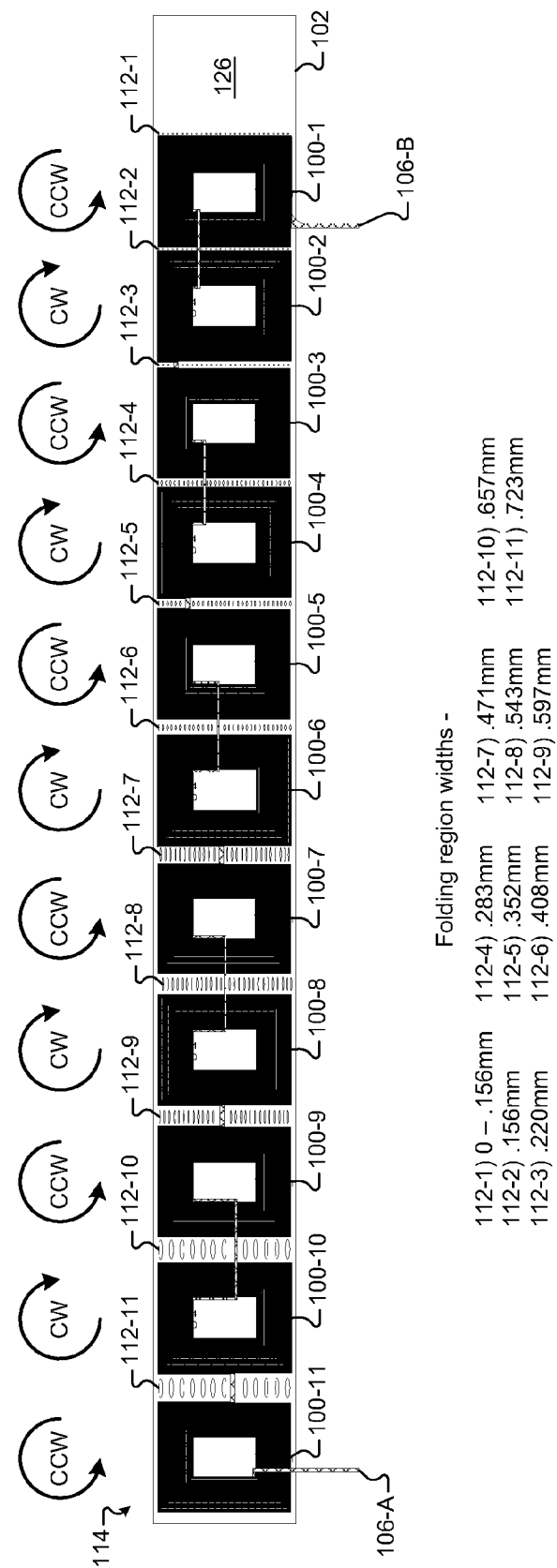
FIG. 6 illustrates an example inductive device including stress relief regions.

Referring now to FIG. 6, an inductive device 114 that includes 11 coils 100-1, 100-2, ..., 100-11 (collectively "coils 100") is shown. Coils 100 are illustrated as darkened regions. The 11 coils 100 are connected in series via conductive interconnects. The conductive interconnects may be fabricated on a separate flexible material layer from coils 100, for example, to prevent shorting of any of coils 100 by the interconnects. As illustrated, coils 100 alternate orientations from a counterclockwise orientation to a clockwise orientation. Adjacent coils 100 are separated by folding regions 112-1, 112-2, ..., 112-11 (collectively "folding regions 112"). Folding regions 12 increase in width (from 112-1 to 112-11) in order to compensate for an increased thickness of inductive device 114 as inductive device 114 is folded, the folding starting from insulating flap 126 and progressing to coil 100-11. For example, folding region 112-1 may be the narrowest folding region, while folding region 112-11 may be the widest folding region. Example widths of folding regions 112 are listed under inductive device 114 in FIG. 6. The example widths listed may correspond to the distances between coils 100 when inductive device 114 is laid flat. In FIG. 6, each of coils 100 may be approximately 5×5 mm.

Each of the folding regions 112 of FIG. 6 may include stress relief portions. The stress relief portions are illustrated in FIG. 6 as ovals/texturing between coils 100 in folding regions 112. The stress relief portions may be fabricated in folding regions 112 so that the portions of flexible substrate 102 in folding regions 112 easily buckle during folding of inductive device 114. For example, stress relief portions may be thinned portions of flexible substrate 102, or may be portions of flexible substrate 102 that include openings (e.g., through holes).

FIG. 7A shows a side view of inductive device 114 of FIG. 6 after folding of each of the coils 100 over one another. As illustrated, inductive device 114 may include a flattened central portion corresponding to coils 100, and rounded end portions corresponding to folding regions 112. FIG. 7B shows an outline of inductive device 114 that has been flexed from its original form as is shown in FIG. 7A. The previously flattened central portion corresponding to coils 100 is deflected in FIG. 7B, illustrating the flexibility of inductive device 114. Flexibility of inductive device 114, as illustrated in FIG. 7B, may allow for inductive device 114 to be formed and fit into devices having substantial space constraints.

Figure 8A:
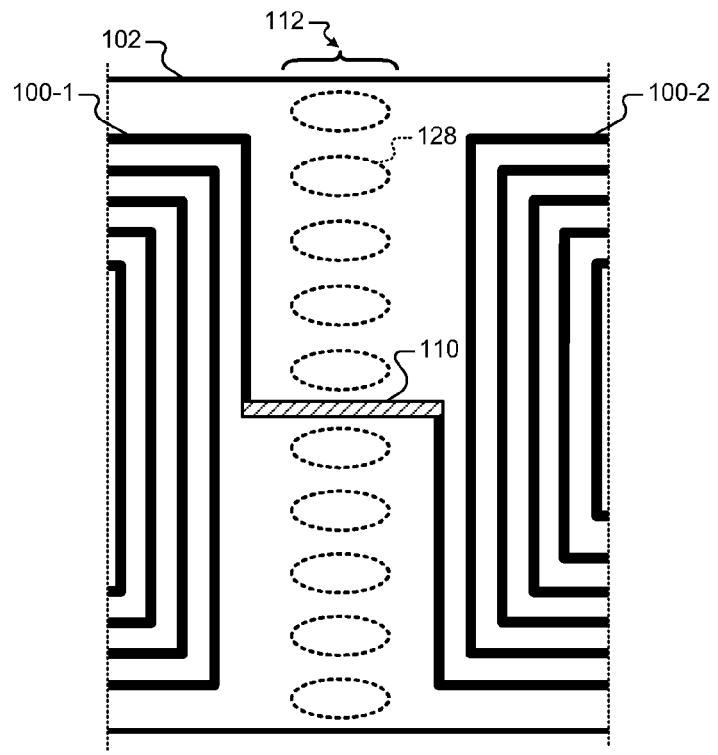
FIGS. 8A-8B show example interconnect configurations and stress relief regions of an inductive device.
Figure 8B:
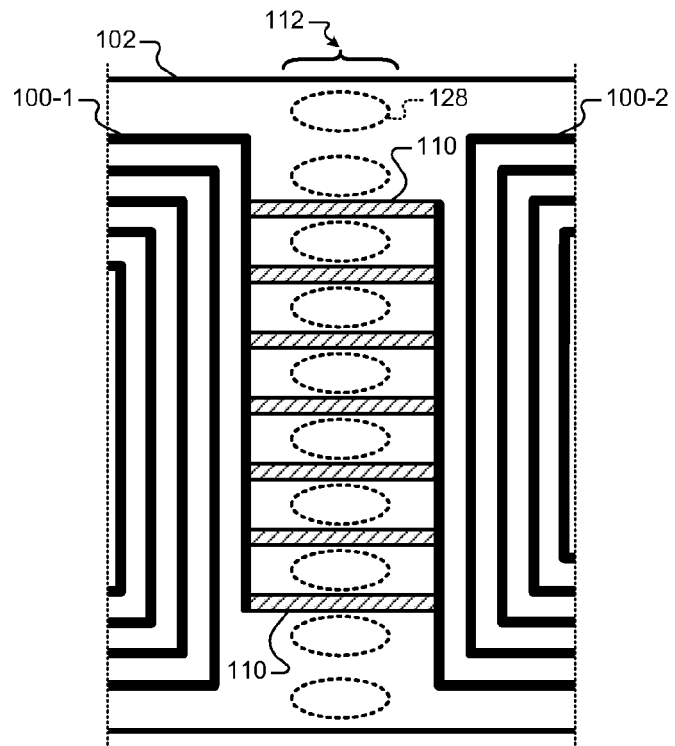

FIGS. 8A-8B illustrate example stress relief areas 128. Stress relief areas 128 are illustrated as dotted ovals. Stress relief areas 128 may be portions (e.g., oval) of flexible substrate 102 that are thin relative to the rest of flexible substrate 102. Alternatively, stress relief areas 128 may include holes through flexible substrate 102. Although stress relief areas 128 are illustrated as ovals in FIGS. 8A-8B, stress relief areas 128 may include other shapes, for example, rectangles, curvilinear shapes, etc.

One or more interconnects 110 may traverse folding region 112. A single interconnect 110 traverses folding region 112 in FIG. 8A, while multiple interconnects 110 traverse folding region 112 in FIG. 8B. The one or more interconnects 110 of FIGS. 8A-8B traverse folding region 112 between stress relief areas 128. In implementations where stress relief areas 128 are openings in flexible substrate 102, the one or more interconnects 110 may traverse folding region 112 in areas between the stress relief areas 128. In implementations where stress relief areas 128 are thin portions of flexible substrate 102, interconnects 110 may traverse folding region 112 over top of stress relief areas 128.

Multiple interconnects 110 as illustrated in FIG. 8B may provide a more reliable interconnection between coils 100 than a single interconnect 110 as illustrated in FIG. 8A. For example, a break in the single interconnect 110 of FIG. 8A, e.g., during folding, may cause an open circuit in the inductive device 114, while multiple interconnects 110 as illustrated in FIG. 8A may require multiple breaks during folding to cause an open circuit in inductive device 114.

Figure 9:
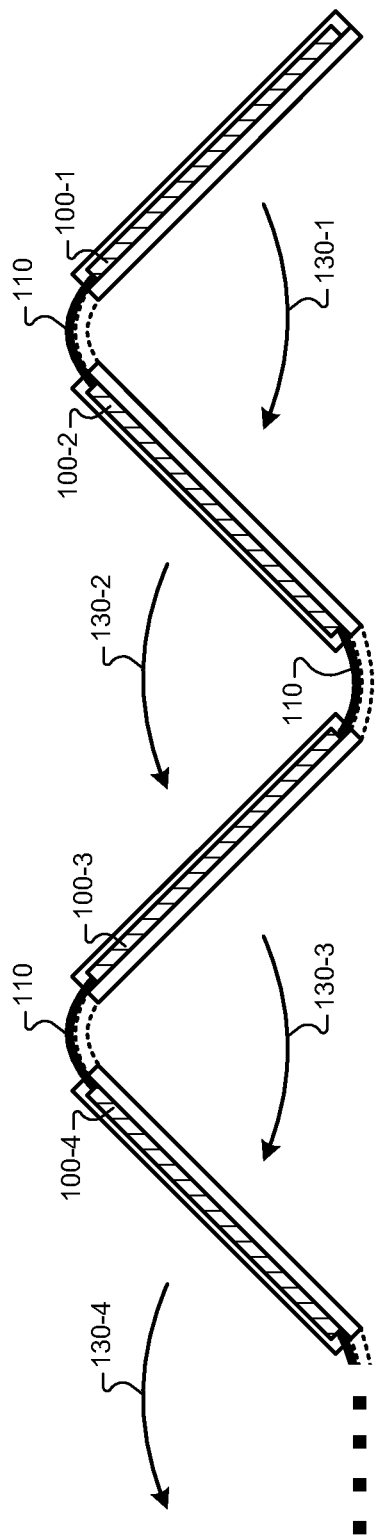
FIG. 9 shows another example folding operation used to fold an inductive device.

Referring now to FIG. 9, a second folding operation for inductive device 114 is shown. Inductive device 114 of FIG. 9 may include some coils 100 which are embedded in flexible substrate 102 since the second folding operation illustrated in FIG. 9 would otherwise cause conductive coils 100 to short out during folding as described herein. Instead of folding coils 100 such that coils 100 are continuously rolled over one another, inductive device 114 of FIG. 9 includes coils 100 that are folded in alternate directions. For example, a portion of flexible substrate 102 under coil 100-1 is folded to contact another portion of flexible substrate under adjacent coil 100-

2, as illustrated at 130-1. Then, inductive device 114 is folded so that a portion of flexible substrate 102 above coil 100-2 contacts a portion of flexible substrate above coil 100-3, as illustrated at 130-2. Since coils 100-2 and 100-3 are embedded in flexible substrate 102, coils 100-2 and 100-3 are insulated from one another during folding at 130-2. Subsequently, a portion of flexible substrate 102 under coil 100-3 is folded to contact another portion of flexible substrate under adjacent coil 100-4, as illustrated at 130-3. The folding continues in a similar manner, illustrated at 130-4, until each of coils 100 of inductive device 114 are folded on top of one another. Coils 100 may be arranged and oriented so that coils 100 of FIG. 9 have the same orientation after folding according to the second folding operation as shown in FIG. 9.

As illustrated in FIG. 9, interconnects 100 may be folded on the inside of a bend, e.g., as illustrated between coils 100-2 and 100-3. Additionally, in the second folding operation, interconnects may be folded on the outside of a bend as illustrated between coils 100-1 and 100-2 and also between coils 100-3 and 100-4.

Figure 10:
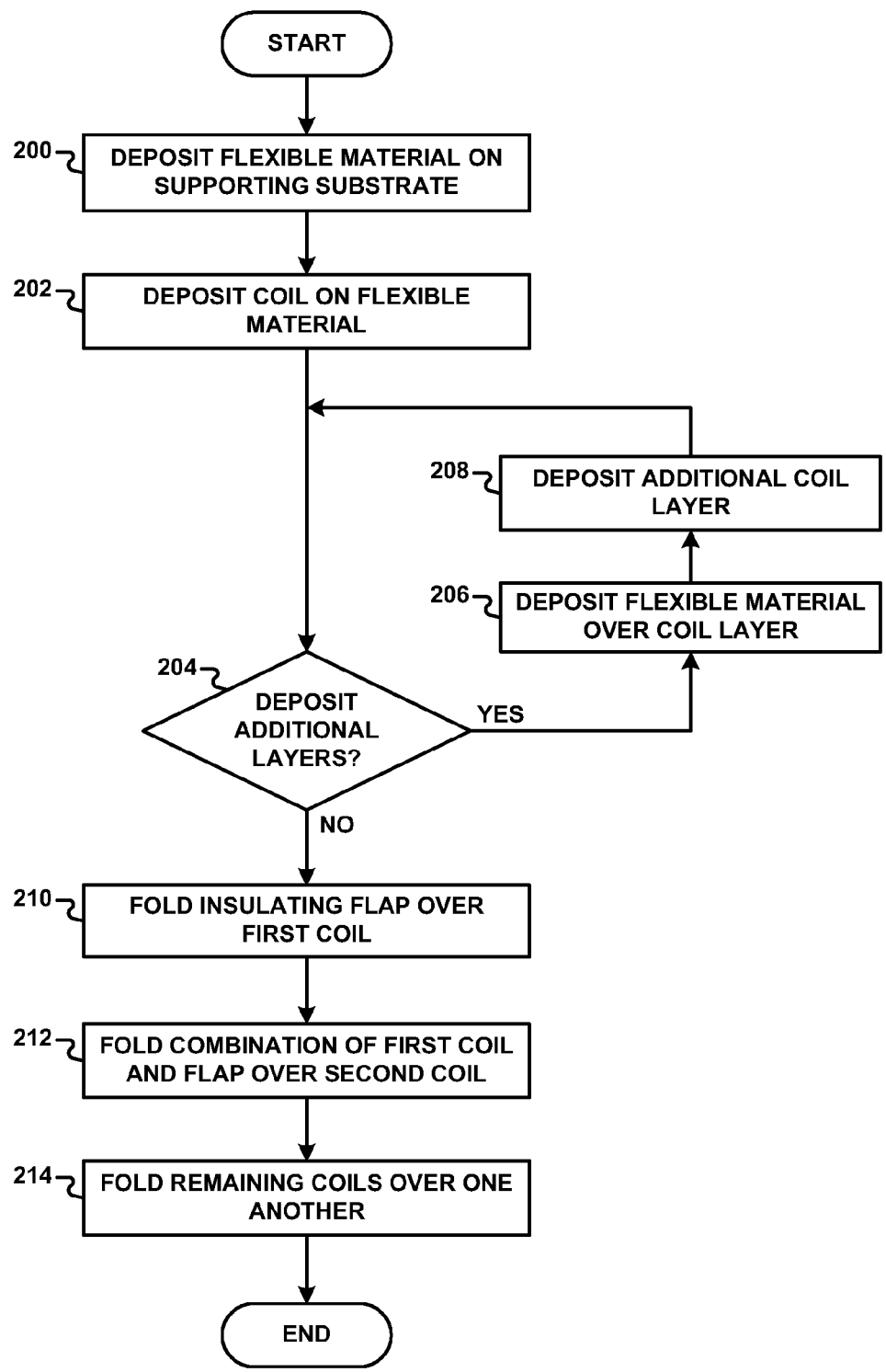
FIG. 10 is a flow diagram that illustrates a method for fabricating a flexible inductive device.

Referring now to FIG. 10, a method for fabricating a flexible inductive device 114 is shown. First, a flexible material is deposited on a support substrate 118 (200) to form flexible substrate 102. For example, polyimide may be deposited on a silicon wafer, e.g., using a spin coating process, to form flexible substrate 102. A coil layer 100-A is then deposited on flexible substrate 102 (202). For example, a metal layer may be deposited on the deposited polyimide layer. If additional coil layers are desired (204), flexible material is deposited over coil layer 100-A (206) and an additional coil layer (e.g., 100-B) is then deposited (208). Inductive device 114 may then be folded. First, insulating flap 126 is folded over coil 100-1 (210). The combination of insulating flap 126 and coil 100-1 is then folded over coil 100-2 (212). The remaining coils 100-3 to 100-n of inductive device 114 are then folded over one another (214) as described above.

Referring now to FIGS. 11-14, fabrication techniques described above (e.g., processing steps and materials) with respect to inductive device 114 may be used to fabricate a flexible transformer. Generally, the flexible transformer includes two separate coils, referred to hereinafter as a primary coil and a secondary coil. For example, a voltage/current may be applied to the primary coil in order to induce a voltage/current in the secondary coil. FIGS. 11-14, illustrate various arrangements of primary and secondary coils that may implement a flexible transformer.

Figure 11:
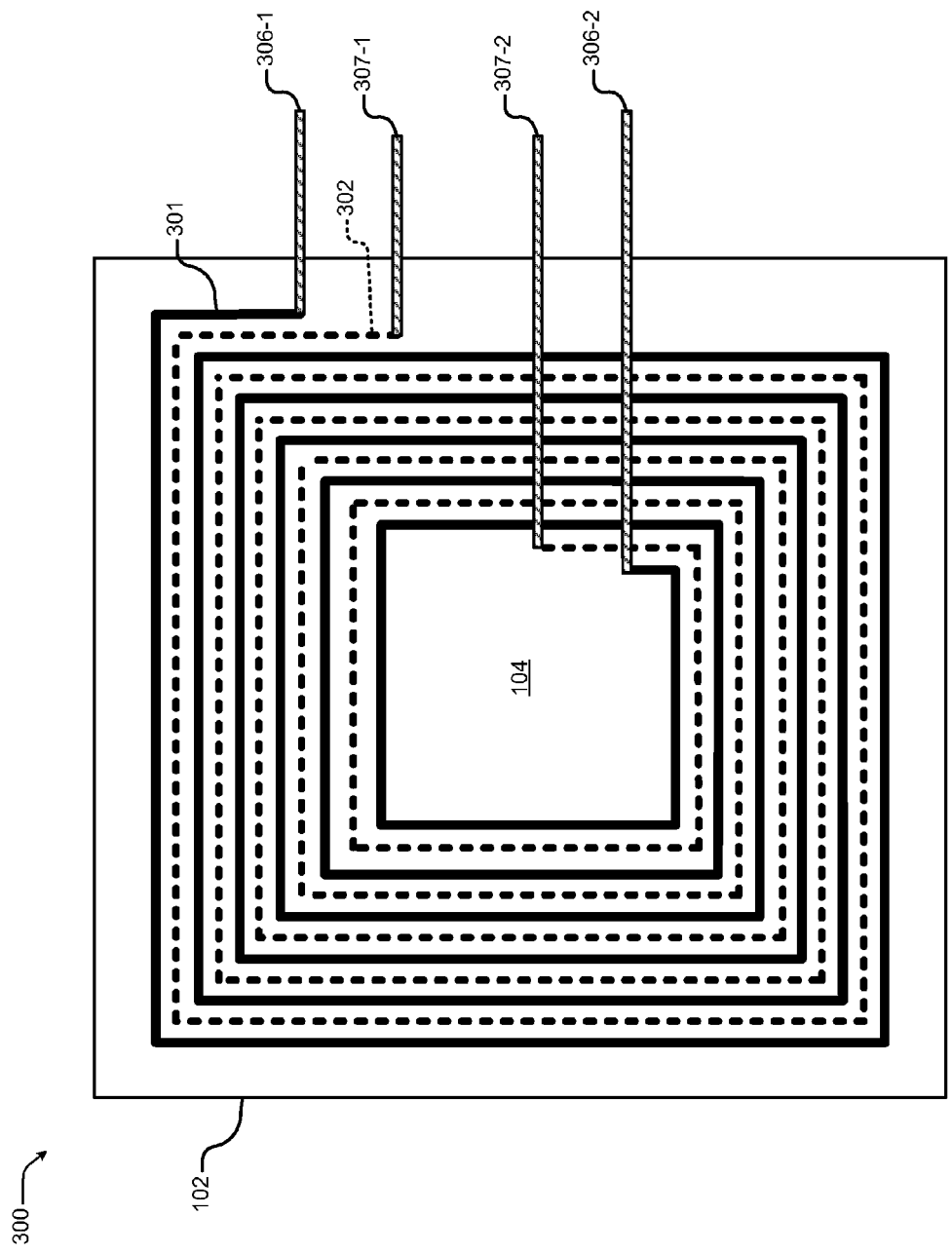
FIG. 11 shows an example flexible transformer.

Referring now to FIG. 11, an example flexible transformer 300 is shown. Flexible transformer 300 of FIG. 11 includes two coils 301 and 302 deposited on flexible substrate 102. Coil 302 is illustrated as a dotted line merely as a representation for illustration purposes, and would be implemented as a solid metal trace in the same manner as coil 301.

Coils 301 and 302 circumscribe core region 104, similar to the inductive device 114. Core region 104 may include the same flexible material used in flexible substrate 102 in some examples, i.e., not include any additional material. In other examples, core region 104 may include material other than flexible substrate 102. For example, core region 104 may include a magnetic material deposited in core region 104 that concentrates flux generated by the coils 301, 302. In some implementations, each of coils 301, 302 of flexible transformer 300 may include multiple coils layers. For example, coil 301 may include one or more layers of coil and coil 302 may include one or more layers of coil, similar to that illustrated in FIGS. 3A-3B.

Flexible transformer 300 includes two sets of leads 306-1, 306-2, and 307-1, 307-2 that provide connection to coils 301, 302. Leads 306-1, 306-2 (collectively "leads 306") provide connection to coil 301. Leads 307-1, 307-2 (collectively "leads 307") provide connection to coil 302. Either coil 301 or coil 302 may serve as the primary coil of flexible transformer 300, however, hereinafter, coil 301 may be referred to as the "primary coil 301" and coil 302 may be referred to as the "secondary coil 302." Interface module 108 (not shown in FIGS. 11-14) may apply voltage across the primary coil 301 at leads 306 to produce a current through the primary coil 301, which in turn produces a magnetic field that induces a corresponding current through secondary coil 302 and a corresponding voltage across secondary coil 302. Interface module 108, or other electronic device may monitor the voltage generated across secondary coil 302. Flexible transformer 300 illustrated in FIG. 11 has a turn ratio of 1:1, i.e., 1 turn of the primary coil for every turn of the secondary coil.

Figure 12:
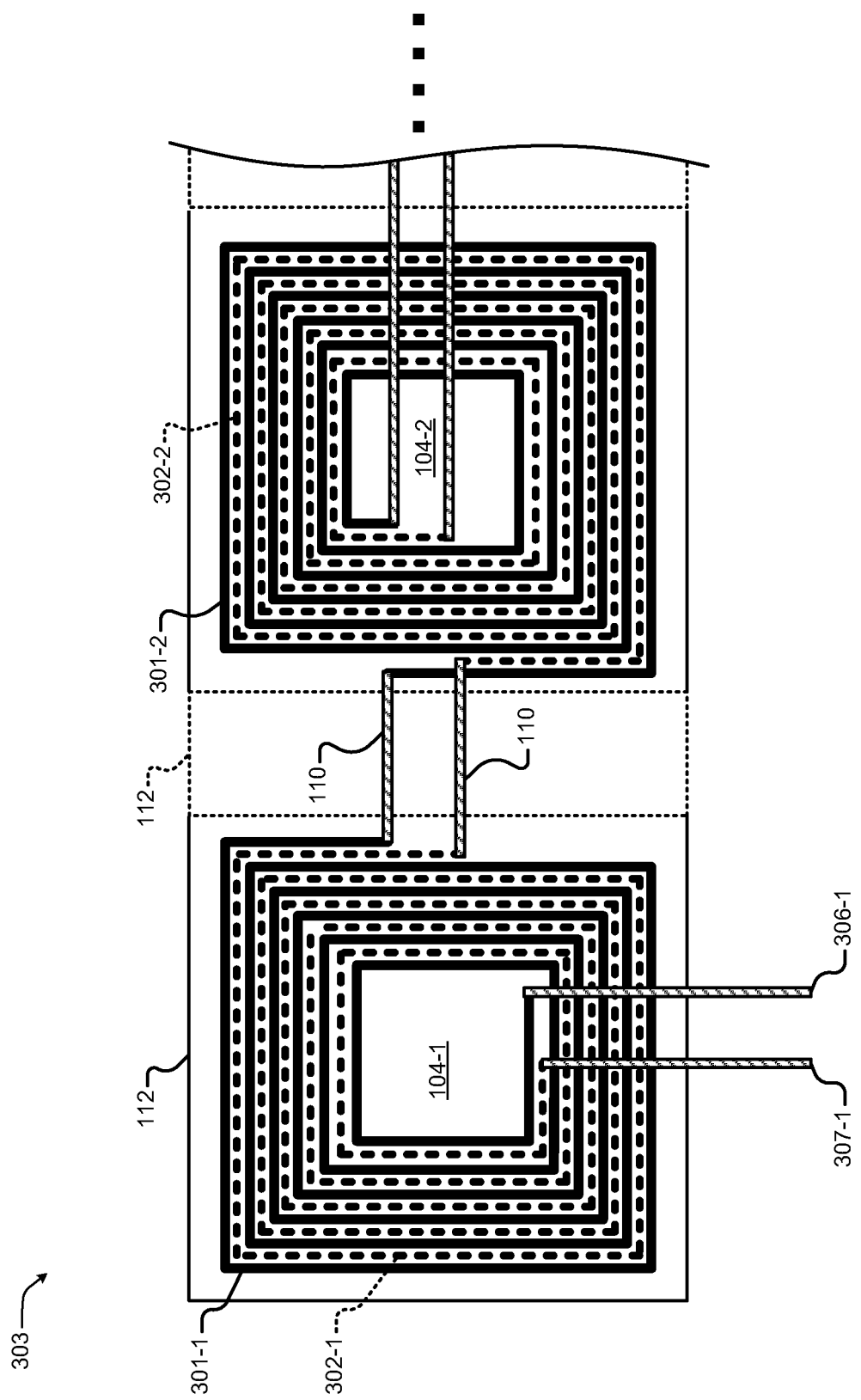
FIG. 12 shows a portion of a flexible transformer that includes a series of interlaced coiled conductors.

Although flexible transformer 300 is illustrated in FIG. 11 as including single coils 301 and 302, flexible transformer 300 may include a plurality of coils, interlaced as in FIG. 11, and connected in series similar to that of FIGS. 1B, 4, and 6. FIG. 12 shows a portion of a flexible transformer 303 that includes a series of interlaced coils 301-1, 301-2 and 302-1, 302-2. Coils 301-1 and 301-2 are oriented so that when flexible transformer 303 is folded at folding region 112, coils 301-1 and 301-2 have the same orientation and coils 302-1 and 302-2 have the same orientation. Accordingly, when folded, a primary coil includes coils 301-1 in combination with 301-2 and a secondary coil includes coils 302-1 and 302-2. Although the turn ratio for the flexible transformer of FIG. 12 is illustrated as 1:1, other turns ratios are contemplated. Other turn ratios may be achieved by varying a total number of coil layers of the primary and secondary coils. Other turn rations may also be achieved by modifying the interlacing pattern of coils, for example, by interlacing only one secondary coil with every other primary coil.

Figure 13:
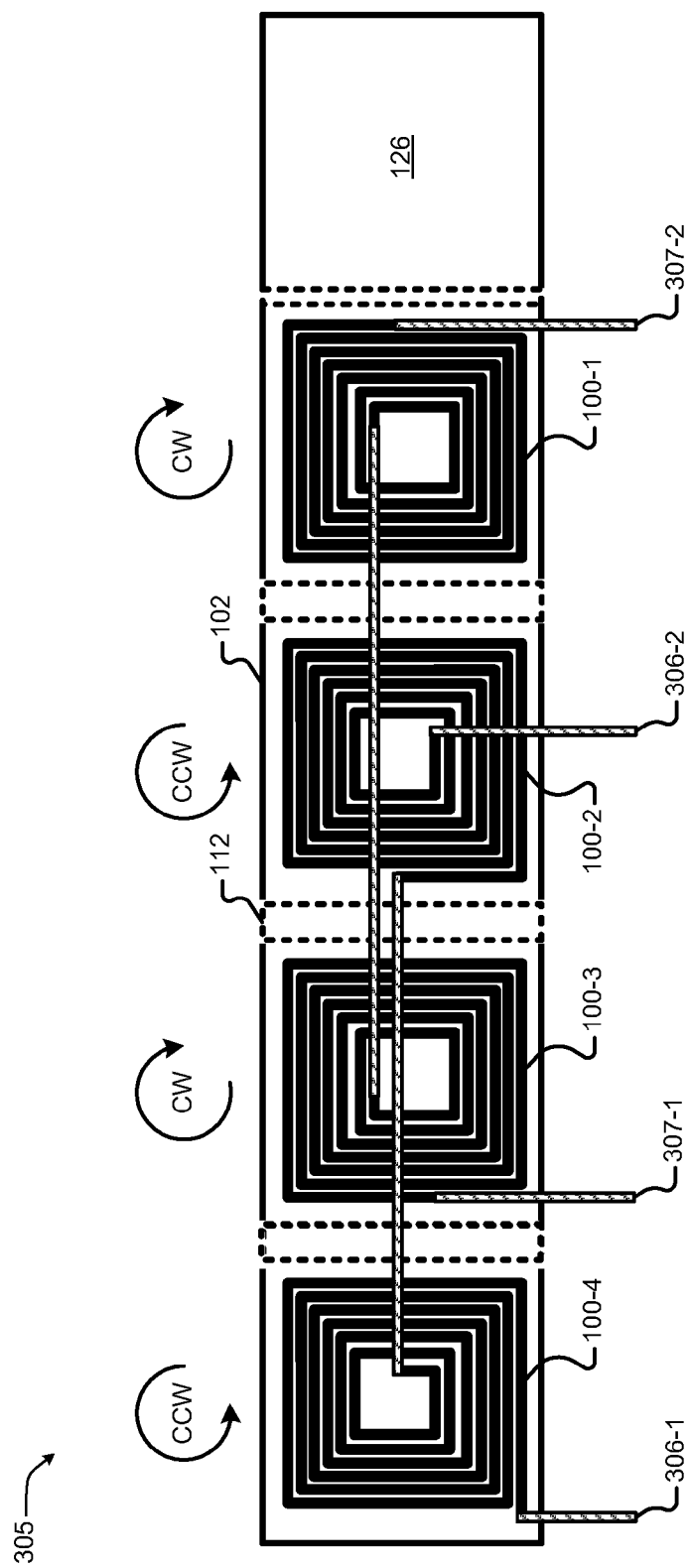
FIG. 13 shows another example flexible transformer in an unfolded state.

Referring now to FIG. 13, another example flexible transformer 305 in an unfolded state is shown. Flexible transformer 305 of FIG. 13 includes coils 100-1 to 100-4, similar to those described with reference to FIG. 4. Coils 100-4 and 100-2, for example, form a primary coil, while coils 100-1 and 100-3 form a secondary coil of flexible transformer 305. Folding of flexible transformer 305 arranges primary and secondary coils of FIG. 13 so that the primary and secondary coils are substantially concentric and so that the coils 100-4, 100-2 comprising the primary coil have the same orientation and so that the coils 100-3, 100-1 comprising the secondary coil have the same orientation. A number of turns in the primary coil may be based on a number of turns per coil in 100-4 and 100-2. Additionally, a number of turns of the primary coil may be based on a total number of coil layers of each of the coils 100-4, 100-2. Similarly, a number of turns in the secondary coil may be based on a number of turns per coil in 100-1 and 100-3. Additionally, a number of turns of the secondary coil may be based on a total number of coil layers of each of the coils 100-1, 100-3.

Figure 14:
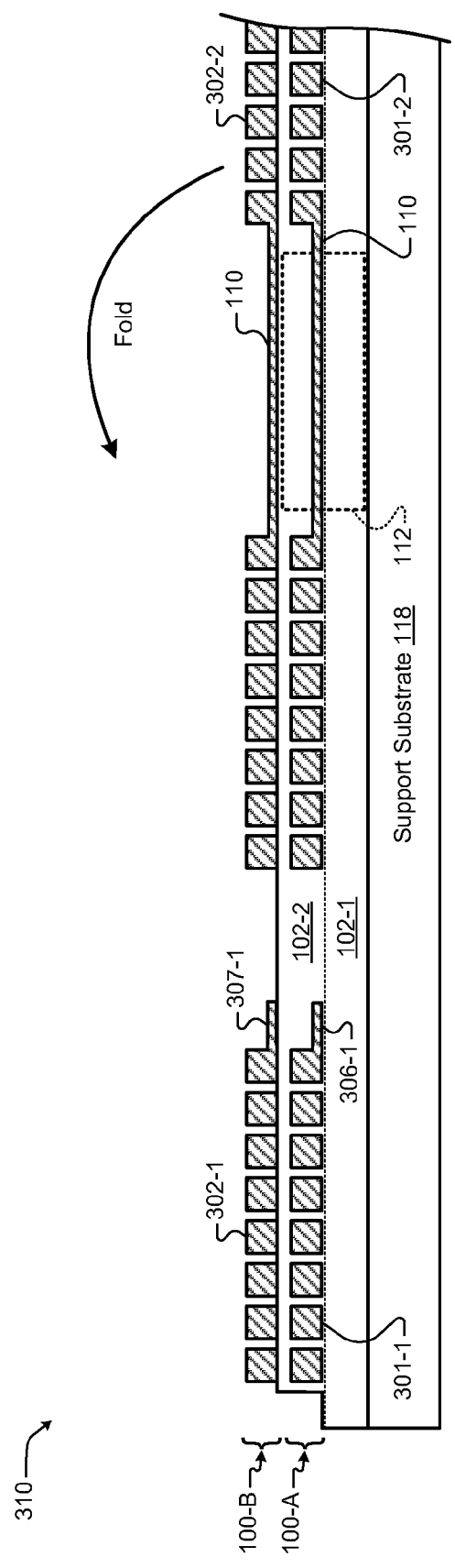
FIG. 14 shows an example cross-sectional view of a flexible transformer.

Referring now to FIG. 14, primary and secondary coils of flexible transformer 310 may be fabricated as separate coil layers as described above. For example, coil layer 100-A may form primary coil 301 (including coils 301-1 and 301-2), while coil layer 100-B may form secondary coil 302 (including coils 302-1 and 302-2). Although only a single layer primary coil 301 and a single layer secondary coil 302 are illustrated, primary and secondary coils of flexible transformer may be formed from multiple coil layers.

Figure 15:
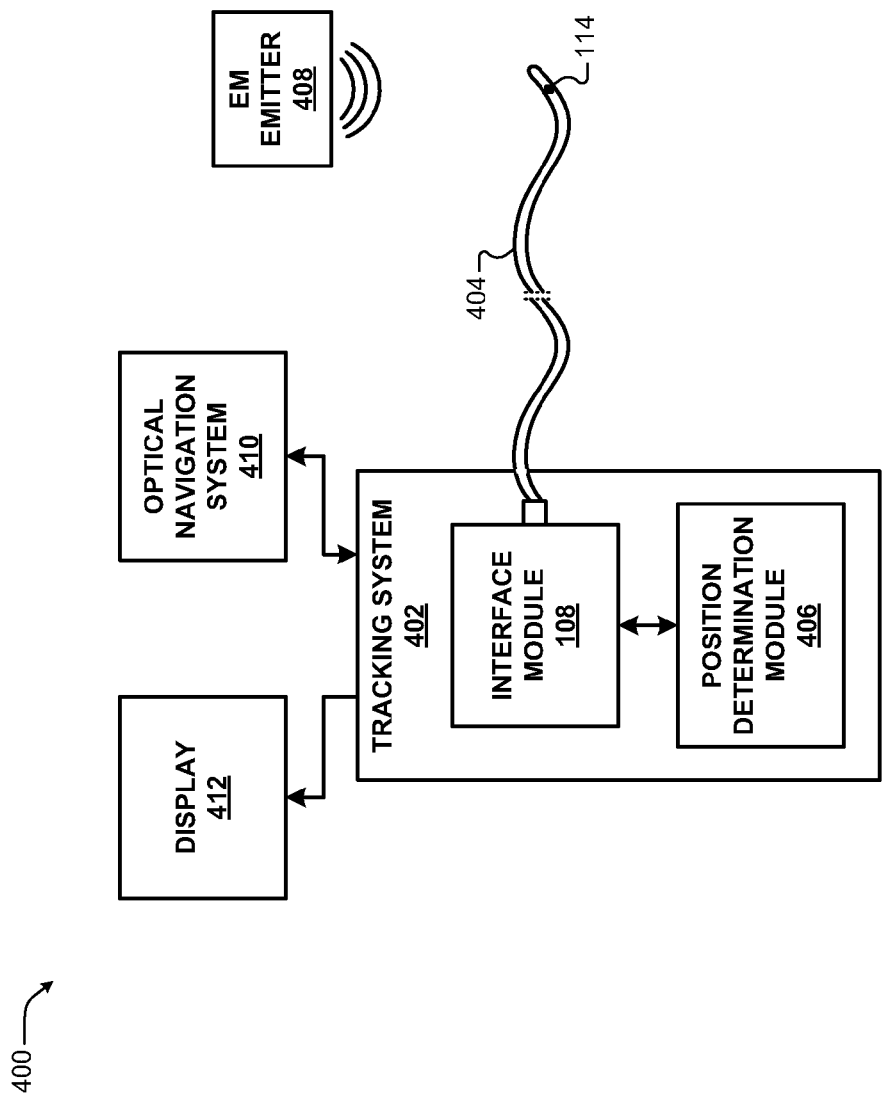
FIG. 15 shows an image guided therapy system that includes an inductive device according to the disclosure.

FIG. 15 shows an image guided therapy (IGT) system 400 that includes inductive device 114 and a tracking system 402. Tracking system 402 includes electronic hardware and software that enables tracking of inductive device 114. As illustrated in FIG. 15, tracking system 402 includes interface module 108 and a position determination module 406 that enables tracking of inductive device 114 included in catheter 404. Although tracking system 402 is illustrated as tracking the position of catheter 404 (i.e., inductive device 114), other surgical instruments that include inductive device 114 may be tracked using tracking system 402. For example, a drug/biologics device (not shown) may include inductive device 114 and, accordingly, may be tracked using tracking system 402. Tracking system 402 outputs, to display 412 in real-time, the position of various instruments that include inductive device 114.

Catheter 404 includes inductive device 114. Catheter 404 may represent, for example, a catheter used in an ablation procedure, a catheter used in a lead placement procedure (e.g., for a pacing/defibrillation device), etc. Catheter 404 and inductive device 114 are connected to interface module 108 of tracking system 402. Inductive device 114 may be connected to interface module 108 using leads (not shown), e.g., 106-A, 106-B as described above. For example, leads 106-A, 106-B of inductive device 114 may be formed into a twisted pair that extends the length of catheter 404 from inductive device 114 to interface module 108. In some examples, interface module 108 may be powered by the voltage/current signals generated by inductive device 114. In other words, a portion of tracking system 402 may be powered by the signals received from inductive device 114.

IGT system 400 includes an electromagnetic field (EM) emitter 408. EM emitter 408 generates an electromagnetic field around a patient (not shown). Tracking system 402 and EM emitter 408 may include components of an electromagnetic tracking technology such as the StealthStation® AxiEM™ surgical navigation system developed by Medtronic Navigation, Inc., of Louisville, Colo. Inductive device 114 receives the electromagnetic field generated by EM emitter 408. Inductive device 114 generates a voltage/current in response to the electromagnetic field generated by EM emitter 408. Interface module 108 receives the voltage/current generated by inductive device 114, e.g., via leads 106-A, 106-B. Interface module 108 may process the voltage/current signals received from inductive device 114. For example, interface module 108 may amplify, filter, and digitize signals received from inductive device 114. A position determination module 406 may process the data received from interface module 108 to determine a position of inductive device 114 in IGT system 400. Accordingly, position determination module 406 may determine the position of inductive device 114 in the patient. For example, position determination module 406 may determine the position of inductive device 114 using triangulation algorithms.

Tracking system 402 may also receive data from other systems in addition to inductive device 114 in order to determine the position of instruments in IGT system 400. For example, IGT system 400 may include an optical navigation system 410 that includes cameras and infrared emitters used to detect the position of instruments in IGT system 400. Tracking system 402 may determine the position of the instruments in IGT system 400 based on data received from optical navigation system 410. For example, tracking system 402 may, using a triangulation algorithm, determine the position of instruments detected by optical navigation system 410.

Although inductive device 114 is illustrated in catheter 404 of IGT system 400, flexible transformer 300 may be included in catheter 404 in addition to, or in lieu of, inductive device 114. For example, coils of flexible transformer 300 may be wired to interface module 108 such that primary and secondary coils of flexible transformer 300 each are used in a similar manner as inductive device 114 for sensing the electromagnetic field generated by EM emitter 408.

Various examples have been described. These and other examples are within the scope of the following claims.

The invention claimed is:

1. A device comprising:
a contiguous flexible substrate;
N coiled conductors deposited on the flexible substrate, the N coiled conductors connected in series by conductive interconnects, wherein the N coiled conductors only cover a portion of the flexible substrate, wherein a remaining portion of the flexible substrate represents an insulating flap that does not include a deposited one of the N coiled conductors, wherein the insulating flap has a profile large enough to cover one of the N coiled conductors; and
a plurality of folding regions in the flexible substrate, each of the folding regions defined by a separation distance between adjacent ones of the N coiled conductors except that at least one folding region in the plurality of folding regions is between the insulating flap and an adjacent one of the N coiled conductors,
wherein the conductive interconnects traverse the folding regions between the N coiled conductors to connect the N coiled conductors in series, wherein the flexible substrate is folded such that the N coiled conductors form a stack of N coiled conductors, wherein the flexible substrate is folded such that the insulating flap is sandwiched between two of the N coiled conductors thereby electrically insulating the two of the N coiled conductors from one another, and wherein N is greater than 1,
wherein the conductive interconnects are deposited on the flexible substrate such that at least one of the conductive interconnects is located at the inside of a bend radius created when the flexible substrate is folded.

2. The device of claim 1, wherein the flexible substrate includes polyimide.

3. The device of claim 1, wherein the N coiled conductors include a metallic material.

4. The device of claim 1, wherein the N coiled conductors share a common axis when the substrate is folded such that the N coiled conductors form the stack of N coiled conductors.

5. The device of claim 1, wherein each of the N coiled conductors circumscribe corresponding center regions a plurality of times, and wherein the center regions share a common axis when the flexible substrate is folded such that the N coiled conductors form the stack.

6. The device of claim 1, wherein at least one of the N coiled conductors includes multiple layers of coils connected in series, and wherein the multiple layers of coils are stacked such that the multiple layers of coils share a common axis.

7. The device of claim 1, wherein at least one of the plurality of folding regions includes stress relief regions formed in the flexible substrate.

8. The device of claim 7, wherein the stress relief regions include one of thinned portions of the flexible substrate or through holes in the flexible substrate.

9. The device of claim 1, wherein the separation distances between the adjacent ones of the N coiled conductors are variable.

10. The device of claim 1, wherein the flexible substrate is folded such that the flexible substrate and the N coiled conductors are rolled, and wherein the N coiled conductors share a common axis.

11. The device of claim 1, further comprising an interface module configured to apply voltage across the N coiled conductors or measure a voltage generated across the N coiled conductors.

12. The device of claim 1, wherein at least one of the N coiled conductors forms a spiral conductor.

13. The device of claim 1, wherein the N coiled conductors of the stack are substantially parallel.

14. The device of claim 1, wherein the N coiled conductors are deposited as a strip of N coiled conductors, wherein a first coiled conductor deposited nearest to the insulating flap is located in a center of the stack, and wherein a second coiled conductor deposited farthest from the insulating flap is located on an outside of the stack.

15. The device of claim 1, wherein the flexible substrate is folded such that N−1 of the N coiled conductors are wrapped around one of the N coiled conductors.

16. A device comprising:
a contiguous flexible substrate;
N coiled conductors deposited on the flexible substrate, the N coiled conductors connected in series by conductive interconnects, wherein the N coiled conductors only cover a portion of the flexible substrate, wherein a remaining portion of the flexible substrate represents an insulating flap that does not include a deposited one of the N coiled conductors, wherein the insulating flap has a profile large enough to cover one of the N coiled conductors;
M coiled conductors which are insulated from the N coiled conductors; and
a plurality of folding regions in the flexible substrate, each of the folding regions defined by a separation distance between adjacent ones of the N coiled conductors except that at least one folding region in the plurality of folding regions is between the insulating flap and an adjacent one of the N coiled conductors,
wherein the conductive interconnects traverse the folding regions between the N coiled conductors to connect the N coiled conductors in series, wherein the flexible substrate is folded such that the N coiled conductors form a stack of N coiled conductors, wherein the flexible substrate is folded such that the insulating flap is sandwiched between two of the N coiled conductors thereby electrically insulating the two of the N coiled conductors from one another,
wherein N is greater than 1, and
wherein M is greater than 1.

17. The device of claim 16, wherein the M coiled conductors are interlaced with the N coiled conductors, wherein the M coiled conductors share a common axis when the flexible substrate is folded, and wherein the M coiled conductors share a common axis with the N coiled conductors when the flexible substrate is folded.

18. The device of claim 16, wherein the M coiled conductors are deposited over top of the N coiled conductors, and wherein the M coiled conductors share a common axis when the flexible substrate is folded.

19. The device of claim 16, wherein the N coiled conductors and the M coiled conductors form a transformer when the flexible substrate is folded, wherein the N coiled conductors form a first coil of the transformer, and wherein the M coiled conductors form a second coil of the transformer.

20. A device comprising:
a contiguous flexible substrate;
N coiled conductors deposited on the flexible substrate and connected in series, wherein the N coiled conductors only cover a portion of the flexible substrate, wherein a remaining portion of the flexible substrate represents an insulating flap that does not include a deposited one of the N coiled conductors, wherein the insulating flap has a profile large enough to cover one of the N coiled conductors,
wherein at least one of the N coiled conductors circumscribes a center region a plurality of times, wherein the flexible substrate is folded such that the N coiled conductors form a stack of N coiled conductors, wherein the flexible substrate is folded such that the insulating flap is sandwiched between two of the N coiled conductors thereby electrically insulating the two of the N coiled conductors from one another within the stack, and wherein N is greater than 1; and
M coiled conductors which are insulated from the N coiled conductors, wherein the N coiled conductors and the M coiled conductors form a transformer when the flexible substrate is folded, wherein the N coiled conductors form a first coil of the transformer, wherein the M coiled conductors form a second coil of the transformer, and wherein M is greater than 1.

21. The device of claim 20, wherein the N coiled conductors share a common axis when the flexible substrate is folded such that the N coiled conductors form the stack of N coiled conductors.

22. The device of claim 20, wherein the N coiled conductors define a plurality of folding regions in the flexible substrate, each of the folding regions defined by a separation distance between adjacent ones of the N coiled conductors, and wherein conductive interconnects traverse the folding regions between the N coiled conductors to connect the N coiled conductors in series.

23. A method comprising:
depositing a flexible material on a support substrate;
depositing N coiled conductors on a portion of the flexible material, wherein the N coiled conductors only cover a portion of the flexible substrate, wherein a remaining portion of the flexible substrate represents an insulating flap portion that does not include a deposited one of the N coiled conductors, wherein the insulating flap has a profile large enough to cover one of the N coiled conductors, and wherein N is greater than 1;
separating the flexible material from the support substrate;
folding the insulating flap portion over one of the N coiled conductors;
folding the flexible material such that the N coiled conductors form a stack of N coiled conductors, wherein the flexible material is folded such that the insulating flap portion is sandwiched between two of the N coiled conductors in the stack thereby electrically insulating the two of the N coiled conductors from one another within the stack; and
depositing M coiled conductors in proximity to the N coiled conductors such that the M coiled conductors are insulated from the N coiled conductors, wherein the N coiled conductors and the M coiled conductors form a transformer when the flexible material is folded, wherein the N coiled conductors form a first coil of the transformer, wherein the M coiled conductors form a second coil of the transformer, and wherein M is greater than 1.

24. The method of claim 23, further comprising folding the flexible material such that the N coiled conductors share a common axis.

25. The method of claim 23, wherein at least one of the N coiled conductors circumscribes a center region a plurality of times.

26. An image guided therapy (IGT) system comprising:
   an inductive device comprising:
      a flexible substrate;
      N coiled conductors deposited on the flexible substrate and connected in series,
         wherein at least one of the N coiled conductors circumscribes a center region a plurality of times, wherein the flexible substrate is folded such that the N coiled conductors form a stack of N coiled conductors, and wherein N is greater than 1; and
      conductive interconnects that electrically connect the N coiled conductors, wherein the conductive interconnects are deposited on folding regions of the flexible substrate such that at least one of the conductive interconnects is located at the inside of a bend radius created when the flexible substrate is folded; and
   a tracking system that receives signals from the inductive device and that determines a position of the inductive device in the IGT system based on the received signals.

27. The IGT system of claim 26, further comprising an emitting device that generates an electromagnetic field, wherein the inductive device generates the signals that are received by the tracking system in response to the electromagnetic field.

28. The IGT system of claim 26, further comprising a catheter that includes the inductive device.

29. The IGT system of claim 26, wherein a portion of the tracking system is powered by the signals from the inductive device.

* * * * *